(12) United States Patent
Yun et al.

(10) Patent No.: US 8,477,288 B2
(45) Date of Patent: Jul. 2, 2013

(54) DIGITAL EXPOSURE METHOD AND DIGITAL EXPOSURE DEVICE FOR PERFORMING THE METHOD

(75) Inventors: Sang-Hyun Yun, Suwon-si (KR); Hi-Kuk Lee, Yongin-si (KR); Sang-Woo Bae, Seoul (KR); Cha-Dong Kim, Cheonan-si (KR); Jung-In Park, Suwon-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 393 days.

(21) Appl. No.: 12/906,623

(22) Filed: Oct. 18, 2010

(65) Prior Publication Data

US 2011/0205508 A1   Aug. 25, 2011

(30) Foreign Application Priority Data

Feb. 19, 2010   (KR) .............................. 2010-0015114

(51) Int. Cl.
*G03B 27/54*   (2006.01)
*G03B 27/42*   (2006.01)

(52) U.S. Cl.
USPC .............................................. 355/67; 355/53

(58) Field of Classification Search
USPC .......................................... 355/52, 53, 67, 77
See application file for complete search history.

(56) References Cited

U.S. PATENT DOCUMENTS

| | | | |
|---|---|---|---|
| 6,428,940 B1 * | 8/2002 | Sandstrom | 430/22 |
| 7,728,956 B2 * | 6/2010 | Bleeker et al. | 355/77 |
| 2002/0135814 A1 * | 9/2002 | Zhou et al. | 358/426.13 |

* cited by examiner

*Primary Examiner* — Hung Henry Nguyen
(74) *Attorney, Agent, or Firm* — F. Chau & Associates, LLC

(57) ABSTRACT

A digital exposure method and a digital exposure device for performing the method are disclosed. In the method, a graphic data system file is produced in correspondence with each of a plurality of patterns formed on a substrate. Then, a digital micromirror device on/off data is generated from the graphic data system file. Then, the substrate is exposed in response to the digital micromirror device on/off data. Thus, at least a first exposure for forming a first pattern of a display panel, and a second exposure for forming identification numbers of a substrate and each display panel and removing an edge portion of the substrate may be simultaneously performed, to simplify the exposure process decrease costs.

15 Claims, 7 Drawing Sheets

DIGITAL EXPOSURE METHOD AND DIGITAL EXPOSURE DEVICE FOR PERFORMING THE METHOD

PRIORITY STATEMENT

This application claims priority under 35 U.S.C. §119 from Korean Patent Application No. 2010-15114, filed on Feb. 19, 2010 in the Korean Intellectual Property Office (KIPO), the contents of which are herein incorporated by reference in their entirety.

BACKGROUND OF THE INVENTION

1. Field of the Invention

Exemplary embodiments of the present invention are directed to a digital exposure method and a digital exposure device for performing the method. More particularly, exemplary embodiments of the present invention are directed to an exposure method, which is capable of simplifying a manufacturing process, and a digital exposure device for performing the method.

2. Description of the Related Art

In general, in a process of manufacturing a printed circuit board ("PCB"), a semiconductor wafer, a substrate of a liquid crystal display ("LCD") panel, etc., a complex circuit pattern is formed on an upper surface of a base substrate such as an insulation substrate or a glass substrate. In order to form the circuit pattern, photolithography methods have been widely used.

According to a photolithography method, a photoresist film is formed on a base substrate, and then the photoresist film is exposed by using a photo mask in which a transfer pattern corresponding to the circuit pattern is formed. Thus, the photo mask is very precisely manufactured, and expensive. Hence, an improved process for reducing the number of the photo masks or a method of exposing the photoresist film without using the photo mask has been researched. In particular, as the size of a substrate of an LCD panel becomes larger, manufacturing and maintenance costs for the photo mask also increase.

A digital exposure method is an example of exposure methods that does not require a photo mask. In this method, an on/off signal controls an exposure beam in correspondence with each pixel of a digital transfer pattern.

However, a digital exposure method involves increased investments for equipment and processing time, since it includes at least a main exposure for forming a pattern of each device, a titler exposure for patterning a cell ID, and an edge exposure for exposing a peripheral region, which are each performed using individual exposure devices.

SUMMARY OF THE INVENTION

Exemplary embodiments of the present invention provide a digital exposure method capable of simplifying an exposure process.

Exemplary embodiments of the present invention also provide a digital exposure device for performing the above-mentioned method.

According to one aspect of the present invention, there is provided a digital exposure method for forming a plurality of patterns on a substrate. In the method, a graphic data system file is produced in correspondence with each of the plurality of patterns to be formed on a substrate. Then, a digital micromirror device on/off data is generated from the graphic data system file. The substrate is then exposed in response to the digital micromirror device on/off data.

In an exemplary embodiment, a step of producing a graphic data system file may include a step of producing a first graphic data system file corresponding to a first pattern of the plurality of patterns for exposing a first area of the substrate, and producing a second graphic data system file corresponding to a second pattern of the plurality of patterns for exposing a second area of the substrate.

In an exemplary embodiment, the first area and the second area may be substantially simultaneously exposed in exposing the substrate in response to the digital micromirror device on/off data.

In an exemplary embodiment, the step of producing a graphic data system file may further include a step of combining the first graphic data system file and the second graphic data system file into a combined graphic data system file.

In an exemplary embodiment, a plurality of the first layers of the first pattern and a plurality of second layers of the second pattern may be respectively combined into one layer, wherein the second layers respectively correspond to the first layers, in combining the first graphic data system file and second graphic data system file.

In an exemplary embodiment, a digital micromirror device on/off data may be further generated from the combined graphic data system file.

In an exemplary embodiment, a step of generating the digital micromirror device on/off data may include a step of generating a first digital micromirror device on/off data from the first graphic data system file, a step of generating a second digital micromirror device on/off data from the second graphic data system file, and a step of combining the first digital micromirror device on/off data and the second digital micromirror device on/off data into a combined digital micromirror device on/off data.

In an exemplary embodiment, the step of combining the first digital micromirror device on/off data and the second digital micromirror device on/off data may be performed by bitwise operations.

In an exemplary embodiment, a step of generating the digital micromirror device on/off data may include a step of generating the first digital micromirror device on/off data from the first graphic data system file.

In an exemplary embodiment, a step of exposing the substrate may include a step of exposing the first area of the substrate in response to the first digital micromirror device on/off data.

In an exemplary embodiment, a second digital micromirror device on/off data may be further generated from the second graphic data system file after exposing the first area of the substrate, and then the second area of the substrate may be exposed in response to the second digital micromirror device on/off data.

In an exemplary embodiment, a scanning speed in exposing the second area of the substrate is greater than a scanning speed in exposing the first area of the substrate.

In an exemplary embodiment, the first area may be an area for forming a liquid crystal display panel, and the second area may include an area for forming an identification number of the substrate and an identification number of the display panel, and may include an edge area of the substrate.

According to another aspect of the present invention, a digital exposure device includes an exposure head and a system control part. The exposure head includes an exposure source and a digital micromirror device. The digital micromirror device reflects an exposure beam received from the exposure source to a substrate to scan the exposure beam to the substrate. The system control part includes a file producing part, a data outputting part and a transfer control part. The file producing part produces a graphic data system file respectively corresponding to each of a plurality of patterns to be formed on a substrate. The data outputting part generates digital micromirror device on/off data from the graphic data system files to control on/off timing of the digital micromirror device. The transfer control part outputs a transfer signal which transfers a stage for exposing the substrate.

In an exemplary embodiment, the file producing part may produce a first graphic data system file corresponding to a first pattern of the plurality of patterns for exposing a first area of the substrate, and a second graphic data system file corresponding to a second pattern of the plurality of patterns for exposing a second area of the substrate.

In an exemplary embodiment, the file producing part may include a file combining part which combines the first graphic data system file and the second graphic data system file to produce a combined graphic data system file.

In an exemplary embodiment, the data outputting part may generate a first digital micromirror device on/off data from the first graphic data system file and a second digital micromirror device on/off data from the second graphic data system file.

In an exemplary embodiment, the data outputting part may include a data combining part which combines the first digital micromirror device on/off data and the second digital micromirror device on/off data to produce a combined digital micromirror device on/off data.

In an exemplary embodiment, the transfer control part may transfer the substrate along a scanning direction in response to the digital micromirror device on/off data generated from the data outputting part.

In an exemplary embodiment, the transfer control part may output the transfer signal in response to the first digital micromirror device on/off data, transfer the substrate in a scanning direction to expose the first areas in a first exposure, reposition the substrate at a starting position, output the transfer signal in response to the second digital micromirror device on/off data, and transfer the substrate in said scanning direction to expose the second areas in a second exposure, wherein a scanning speed of the second exposure is greater than a scanning speed of the first exposure.

According to a digital exposure method and a digital exposure device for performing the method, at least a first exposure for forming a pattern of a display panel, and a second exposure for forming identification numbers of a substrate and each display panel and removing an edge portion of the substrate may be substantially simultaneously performed, to simplify the exposure process and reduce costs.

DETAILED DESCRIPTION OF THE INVENTION

Figure 1:
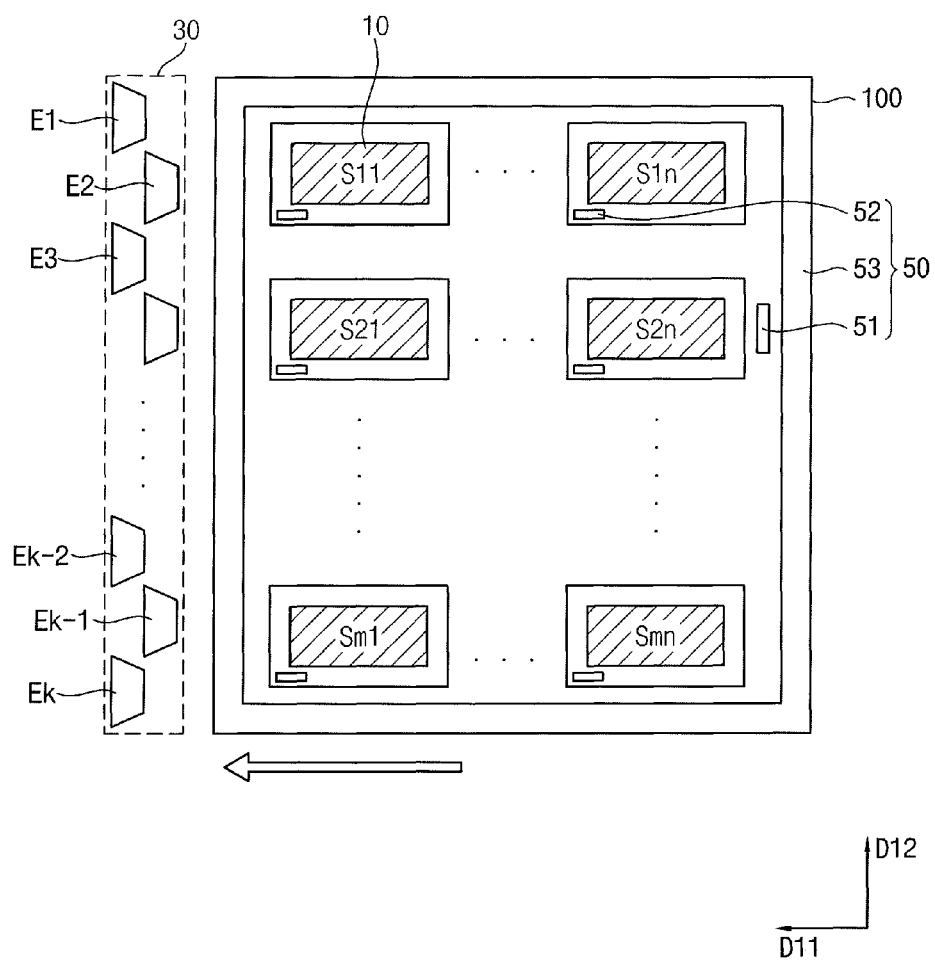
FIG. 1 is a plan view showing an exposure device according to an exemplary embodiment of the present invention.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. In the drawings, the sizes and relative sizes of layers and regions may be exaggerated for clarity. It will be understood that when an element or layer is referred to as being "on," "connected to" or "coupled to" another element or layer, it can be directly on, connected or coupled to the other element or layer or intervening elements or layers may be present. Like numerals may refer to like elements throughout.

Hereinafter, the present invention will be explained in detail with reference to the accompanying drawings.

FIG. 1 is a plan view showing an exposure device according to an exemplary embodiment of the present invention.

Referring to FIG. 1, a substrate 100 is a main substrate for forming a display panel. The substrate 100 includes a plurality of first areas 10 and a plurality of second areas 50 excluding the first areas 10. A plurality of display panels S11, . . . , Smn arranged in a matrix shape with one display panel formed in each first area 10. In this case, 'm' and 'n' are natural numbers. The second areas 50 includes a glass ID areas 51 where an identification number of the substrate 100 is formed, and cell ID areas 52 where an identification number of the display panels is formed. In addition, the second areas 50 include an edge exposure area 53 that is an edge portion of the substrate 100.

The substrate 100 is transferred below an exposure part 30 along a first direction D11 to be exposed. The substrate 100 is transferred to the exposure part 30 by a stage (not shown) disposed below the substrate 100.

To expose the substrate 100, a step exposing method or a scan exposing method may be employed. In a step exposing method, a substrate is transferred and stopped repeatedly during exposing. In a scan exposing method, a substrate is continuously transferred during exposing. For example, an island pattern may be formed through a step exposing method, and a strip pattern may be formed through a scan exposing method.

The exposure part 30 includes a plurality of exposure heads E1, E2, E3, . . . , Ek-2, Ek-1 and Ek. The exposure heads E1, E2, E3, . . . , Ek-2, Ek-1 and Ek are arranged in a second direction D12 substantially perpendicular to the first direction D11. In this case, 'k' is a natural number.

For example, the exposure heads E1, E2, E3, . . . , Ek-2, Ek-1 and Ek are disposed in two rows. The exposure heads of a first row and the exposure heads of a second row may be alternately disposed in the second direction D12. Although not shown in FIG. 1, the exposure heads E1, E2, E3, . . . , Ek-2, Ek-1 and Ek may have various arrangements in the second direction D12.

The exposure part 30 exposes the substrate 100 being transferred in the first direction D11, so that an exposure pattern is formed in a reverse direction of the first direction D11.

The exposure heads E1, E2, E3, ..., Ek-2, Ek-1 and Ek include a digital micromirror device ("DMD"). The DMD may irradiate an exposure beam in response to an on/off data signal. A source beam from a digital mirror of a cell of the DMD is reflected to generate the exposure beam, and the exposure beam exits from the exposure heads E1, E2, E3, ..., Ek-2, Ek-1 and Ek.

Figure 2:
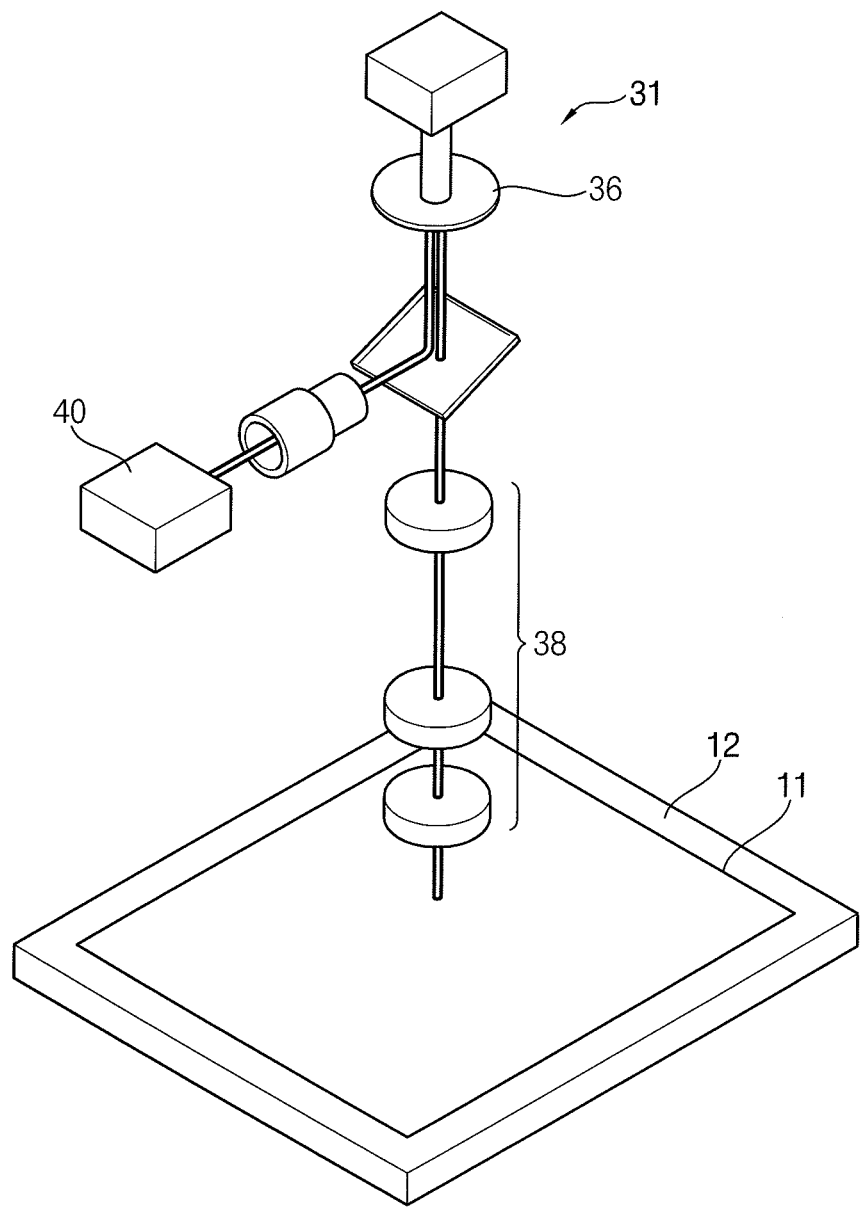
FIG. 2 is a perspective view showing an exposure head according to an exemplary embodiment of the exposure device of FIG. 1.

FIG. 2 is a perspective view showing an exposure head according to an exemplary embodiment of the exposure device of FIG. 1.

Referring to FIGS. 1 and 2, the exposure head 31 includes the DMD 36. The DMD 36 receives the source beam from an exposure source 40. The source beam may be an ultraviolet (UV) ray for exposing a photoresist film 11. The photoresist film 11 is formed on a target substrate 12 corresponding to an object to be exposed. When a pattern needs to be formed on a substrate, the photoresist film 11 is used to form a mask of the pattern. The photoresist film 11 may be formed by coating a photosensitive resin such as an epoxy resin on a surface of a glass substrate. The DMD 36 selectively reflects the source beam for each pixel based on image data transferred onto the target substrate 12.

The exposure head 31 includes a projection optical device 38. The projection optical device 38 includes a plurality of lenses, and converts light selectively reflected from the DMD 36 into the exposure beam.

Figure 3:
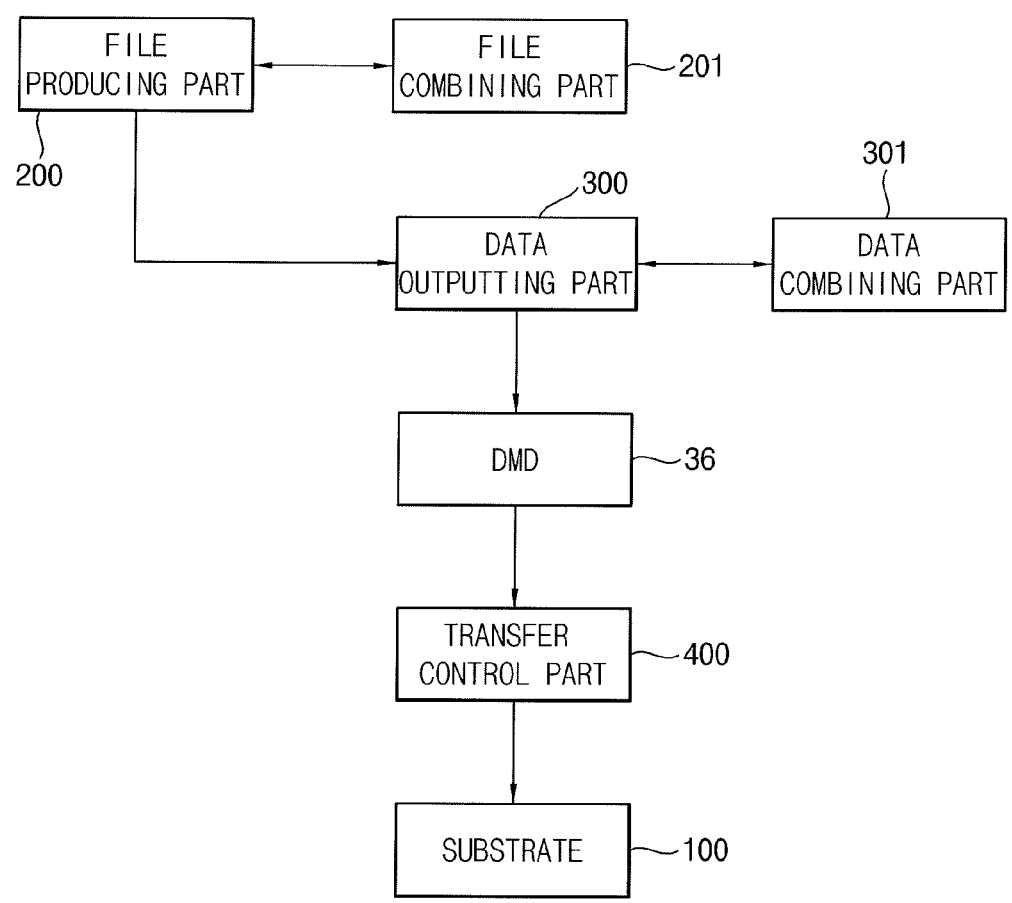
FIG. 3 is a block diagram of a system control part according to an exemplary embodiment of the exposure device of FIG. 1.

FIG. 3 is a block diagram of a system control part according to an exemplary embodiment of the exposure device of FIG. 1.

Referring to FIGS. 1 and 3, the system control part 500 may include a file producing part 200, a data outputting part 300 and a transfer control part 400.

The file producing part 200 produces a graphic data system ("GDS") file. The GDS file is an inverse of a multilayered computer-aided design (CAD) file. For example, the GDS file includes data for each layer such as a gate pattern, an active pattern, source drain patterns, and so on.

The GDS file includes at least a first graphic system ("GDS1") file and a second graphic system ("GDS2") file. The GDS1 file includes data about a first pattern formed in the first areas 10. The GDS2 file includes data about a second pattern formed in the second areas 50. In other exemplary embodiments, the GDS file may include graphic system files for other patterns to be formed.

The file producing part 200 may include a file combining part 201. The file combining part 201 combines the GDS1 file with the GDS2 file that are produced by the file producing part 200. The file combining part 201 combines data of each layer for the first areas 10 and data of each layer for the second areas 50 into data of one layer. In combining the GSD1 file and the GSD2 file, the layers of the second file respectively correspond to the layers of the first file.

The data outputting part 300 generates the DMD on/off data from the GDS file. For example, first digital micromirror device ("DMD1") on/off data is generated from the GDS1 file, and second digital micromirror device ("DMD2") on/off data is generated from the GDS2 file. The DMD on/off data is generated from the GDS file combined in the file combining part 201. In other exemplary embodiments having more than two patterns, DMD on/off data is generated from each GSD file.

The data outputting part 300 may include a data combining part 301. The data combining part 301 combines the DMD1 on/off data and the DMD2 on/off data. The data combining part 301 performs bitwise operations to combine the DMD1 on/off data and the DMD2 on/off data. In other exemplary embodiments having more than two patterns, the other DMD on/off data may also be combined by the data combining part 301.

The transfer control part 400 outputs a transfer signal which transfers the stage (not shown) along the first direction D11 and the second direction D21. The transfer control part 400 controls on/off timing of the exposure beam in response to the DMD on/off data supplied from the data outputting part 300, and transfers the stage.

The transfer control part 400 may increase a speed of the stage if only the DMD2 on/off data is output from the data outputting part 300.

Figure 4:
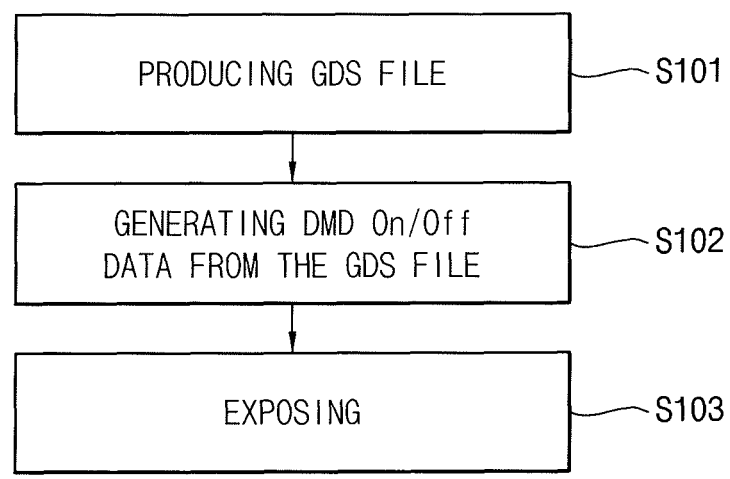
FIG. 4 is a flowchart showing a method of exposing according to an exemplary embodiment of the present invention.

FIG. 4 is a flowchart showing a method of exposing according to an exemplary embodiment of the present invention. Referring to FIG. 4, an exposure method according to the present embodiment includes a step of producing the GDS file corresponding to each of at least two patterns formed on a substrate 100 (step S101), a step of generating DMD on/off data from the GDS file (step S102), and a step of exposing the substrate 100 in response to the DMD on/off data (step S103).

The step of producing the GDS file includes a step of producing the GDS1 file for exposing the first area 10 of the substrate 100, and a step of producing the GDS2 file for exposing the second area 50 of the substrate 100 (step S101).

The GDS1 file and the GDS2 file are produced by the file producing part 200. The GDS1 file includes data for the first patterns formed in the first areas 10. The GDS2 file includes data for the second patterns formed in the second areas 50.

The DMD on/off data is generated from the GDS file in the data outputting part 300 (step S102). An on/off file for generating the DMD on/off data may be configured by '1's and '0's in a binary file. In this embodiment, when the on/off data is '1', the DMD is turned on so that light is delivered to a substrate. Alternatively, when the on/off data is '0', the DMD is turned off so that the light is not delivered to the substrate.

The DMD selectively reflects the light based on the DMD on/off data to expose the substrate 100 according to the data of the first and second patterns stored in the GDS file. Therefore, a substrate having the first and second patterns may be formed.

Figure 5:
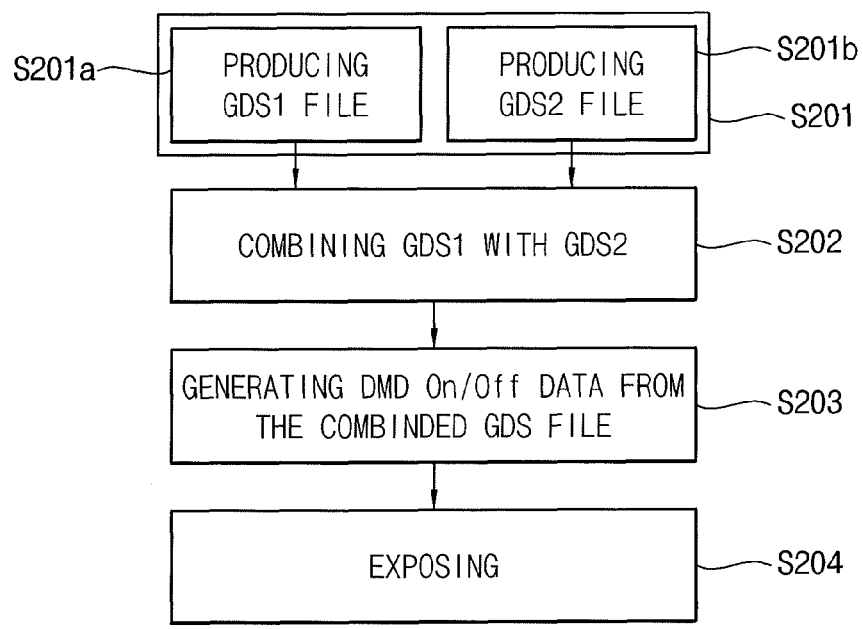
FIG. 5 is a flowchart showing a method of exposing according to another exemplary embodiment of the present invention.

FIG. 5 is a flowchart showing a method of exposing according to another exemplary embodiment of the present invention.

Referring FIGS. 1 to 3 and 5, the GDS1 file is produced by the file producing part 200 (step S201a of step 201). Moreover, the GDS2 file is produced by the file producing part 200 (step S201b of step 201). The GDS1 file includes the data for the first patterns to be formed in the first areas 10, and the GDS2 file includes the data for the second patterns to be formed in the second areas 50.

The file combining part 201 combines the GDS1 file and the GDS2 file into one file (step S202). In step S202, data corresponding to each layer of each GDS file is combined into one layer. For example, data for forming a gate layer having the first pattern in the first areas 10 is combined with data for forming a gate layer having the second pattern in the second areas 50 to form one layer.

The data outputting part 300 generates the DMD on/off data from the GDS1 and GDS2 files combined with each other (step S203). Then, the first areas 10 and the second areas 50 of the substrate 100 are exposed in response to the on/off data (step S204). The first areas 10 and the second areas 50 are exposed at the same time.

According to the present embodiment, two files are formed, each having respective data of the first and second patterns, and are combined as one file. Then, the DMD on/off data is generated from the combined file to expose the substrate, so that the first areas having the first pattern and the second areas having the second pattern are substantially simultaneously exposed using a digital exposure device.

Figure 6:
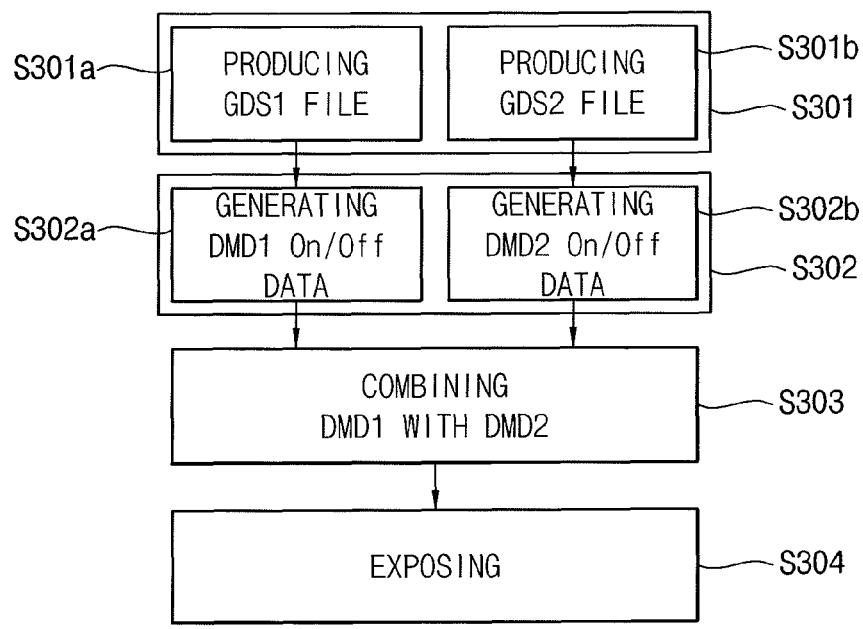
FIG. 6 is a flowchart showing a method of exposing according to still another exemplary embodiment of the present invention.
Figure 7:
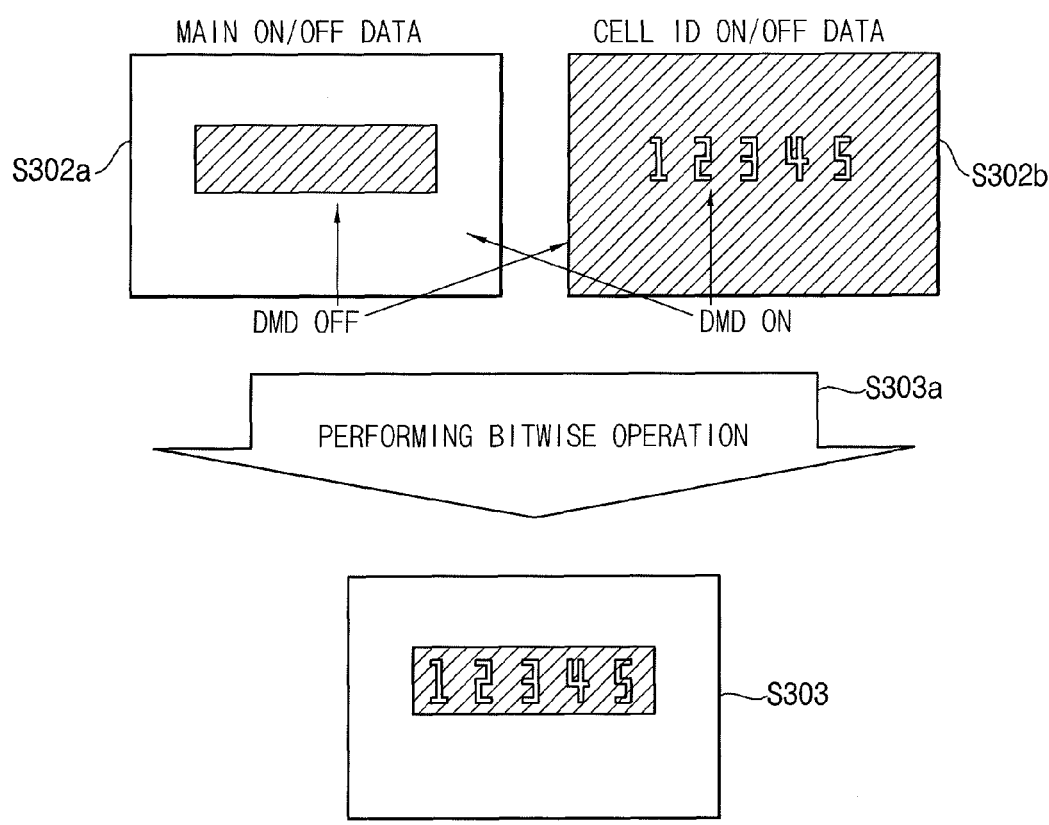
FIG. 7 is a block view showing a method of exposing of FIG. 6.

FIG. 6 is a flowchart showing a method of exposing according to still another exemplary embodiment of the present invention. FIG. 7 is a block view showing a method of exposing of FIG. 6.

Referring to FIGS. 6 and 7, the file producing part 200 produces the GDS1 file (step S301a of step 301). In addition, the file producing part 200 produces the GDS2 file (step S301b of step 301). The GDS1 file includes the data of the first patterns to be formed in the first areas 10. The GDS2 file includes the data of the second patterns to be formed in the second areas 50.

The data outputting part 300 produces the DMD1 on/off data from the GDS1 file (step S302a of step 302). In addition, the data outputting part 300 produces the DMD2 on/off data from the GDS2 file (step S302b of step 302).

The data combining part 301 combines the DMD1 on/off data with the DMD2 on/off data (step S303).

The DMD1 data is on for the first areas 10, and is off for the second areas 50 such as the areas 51 and 52 for forming the identification numbers of the display panels S11, S12, . . . , Smn. Accordingly, light may be irradiated to form the display panel having the first pattern in the first areas 10.

In contrast, the DMD2 data is off for the first areas 10, and is on for the second areas 50. Accordingly, light may be irradiated to form the identification numbers of the substrate 100 and the panels S11, S12, . . . , Smn having the second pattern and to remove the edge portion 53 of the substrate 100 in the second areas 50.

The DMD1 on/off data and the DMD2 on/off data are combined into one on/off data by performing bitwise operations (step S303). The first areas 10 and the second areas 50 on the substrate 100 are exposed in response to the combined DMD on/off data (step S304). The first areas 10 and second areas 50 are substantially simultaneously exposed.

According to the present embodiment, two files each having each data for the first and second patterns are formed. Then, each DMD on/off data file is generated from the two files, and is combined into one data file. Then, the substrate is exposed in response to the combined data file, so that the first areas having the first pattern and the second areas having the second pattern are substantially simultaneously exposed using a digital exposure device.

Figure 8:
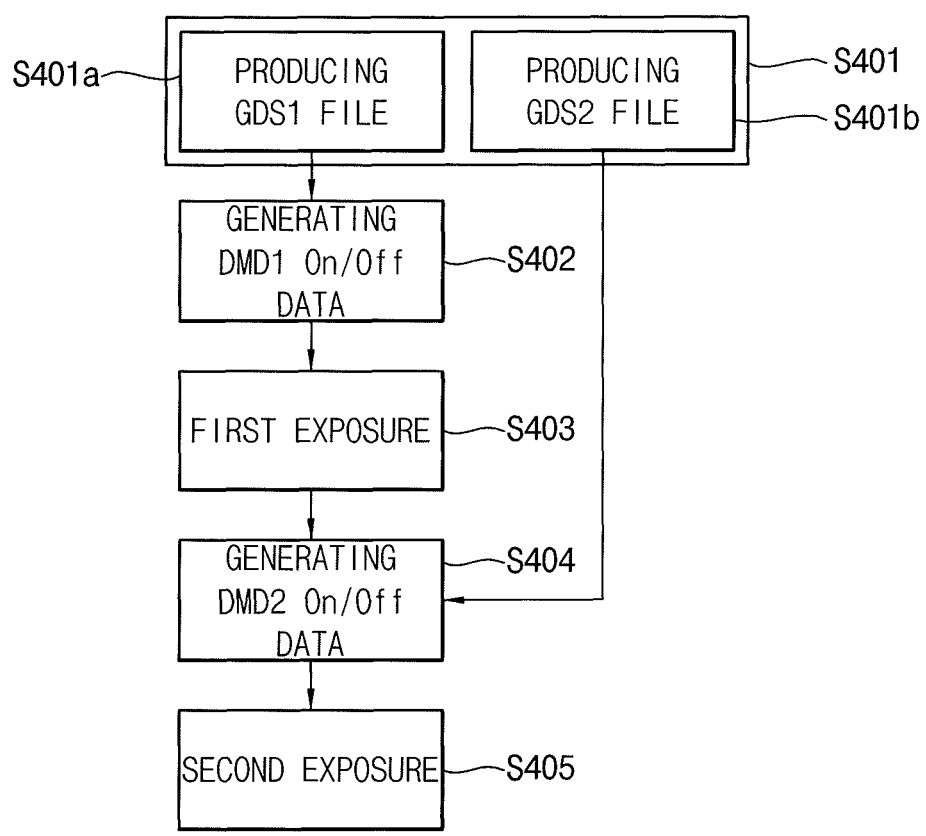
FIG. 8 is a flowchart showing a method of exposing according to still another exemplary embodiment of the present invention.

FIG. 8 is a flowchart showing a method of exposing according to still another exemplary embodiment of the present invention.

Referring to FIG. 8, the file producing part 200 produces the GDS1 file (step S401a of step 401). In addition, the file producing part 200 produces the GDS2 file (step S401b of step 401). The GDS1 file includes the data for the first patterns to be formed in the first areas 10. The GDS2 file includes the data for the second patterns to be formed in the second areas 50.

The data outputting part 300 generates the DMD1 on/off data from the GDS1 file (step S402). Then, the transfer control part 400 outputs the transfer signal in response to the DMD1 on/off data, and transfers the substrate 100 in a scanning direction to expose the first areas 10 (step S403) in a first exposure.

After exposing the first area 10, the data outputting part 300 generates the DMD2 on/off data from the GDS2 file (step S404).

The first areas 10 have been exposed, and the substrate having the first pattern is positioned at a starting position again. Then, the transfer control part 400 outputs the transfer signal in response to the DMD2 on/off data, and transfers the substrate 100 in a scanning direction to expose the second areas 50 (step S405) in a second exposure.

The transfer control part 400 increases a scanning speed in the second exposure with respect to the scanning speed in the first exposure. In an exemplary embodiment, the scanning speed of the second exposure is at least twice the scanning speed of the first exposure. However, this second scanning speed is exemplary and non-limiting, and other second scanning speeds are within the scope of other embodiments of the invention. The first exposure exposes the first areas which has a fine pattern requiring precision, and controls the scanning speed to form a precise pattern. In addition, the second exposure exposes the second areas which have larger and simpler patterns as compared to the first areas, and the scanning speed in the second exposure is increased to reduce exposure time.

According to embodiments of the present invention, two files each having data for the first and second patterns are formed, and DMD on/off data is generated from the file to expose the substrate, so that the first areas having the first pattern and the second areas having the second pattern are substantially simultaneously exposed using a digital exposure device.

Although exemplary embodiments of the invention have been described in terms of a substrate having two patterns, one of ordinary skill in the art may easily extend the teachings herein to exposure methods for substrates having more than two patterns formed thereon.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the novel teachings of the present invention. Accordingly, all such modifications are intended to be included within the scope of the present invention as defined in the appended claims. Embodiments of the present invention are defined by the following claims, with equivalents of the claims to be included therein.

What is claimed is:

1. A digital exposure method for forming a plurality of patterns on a substrate, the method comprising:
producing a graphic data system file corresponding to each of the plurality of patterns to be formed on the substrate, including a first graphic data system file corresponding to a first pattern of the plurality of patterns for exposing a first area of the substrate, and a second graphic data system file corresponding to a second pattern of the plurality of patterns for exposing a second area of the substrate, and combining the first graphic data system file and the second graphic data system file into a combined graphic data system file, wherein a plurality of first layers of the first pattern and a plurality of second layers of the second pattern are respectively combined into one layer, wherein the second layers respectively correspond to the first layers, in combining the first graphic data system file and the second graphic data system file;
generating digital micromirror device on/off data from the graphic data system file; and
exposing the substrate in response to the digital micromirror device on/off data.

2. The method of claim 1, wherein the first area and the second area are simultaneously exposed in exposing the substrate in response to the digital micromirror device on/off data.

3. The method of claim 1, wherein generating the digital micromirror device on/off data comprises:

generating the digital micromirror device on/off data from the combined graphic data system file.

4. The method of claim 1, wherein generating the digital micromirror device on/off data comprises:
generating a first digital micromirror device on/off data from the first graphic data system file;
generating a second digital micromirror device on/off data from the second graphic data system file; and
combining the first digital micromirror device on/off data and the second digital micromirror device on/off data into a combined digital micromirror device on/off data.

5. The method of claim 4, wherein combining the first digital micromirror device on/off data and the second digital micromirror device on/off data is performed by bitwise operations.

6. The method of claim 1, wherein generating the digital micromirror device on/off data comprises:
generating the first digital micromirror device on/off data from the first graphic data system file.

7. The method of claim 6, wherein exposing the substrate comprises:
exposing the first area of the substrate in response to the first digital micromirror device on/off data.

8. The method of claim 7, further comprising:
generating a second digital micromirror device on/off data from the second graphic data system file after exposing the first area of the substrate; and
exposing the second area of the substrate in response to the second digital micromirror device on/off data.

9. The method of claim 8, wherein a scanning speed for exposing the second area of the substrate is greater than a scanning speed for exposing the first area of the substrate.

10. The method of claim 1, wherein the first area comprises an area for forming a liquid crystal display panel, and the second area comprises an area for forming an identification number of the substrate, an area for forming an identification number of the display panel, and an edge area of the substrate.

11. A digital exposure device comprising:
an exposure head comprising an exposure source and a digital micromirror device, the digital micromirror device reflecting an exposure beam received from said exposure source to a substrate to scan said exposure beam onto the substrate; and
a system control part comprising:
a file producing part for producing a graphic data system file respectively corresponding to each of a plurality of patterns to be formed on a substrate, including a first graphic data system file corresponding to a first pattern of the plurality of patterns for exposing a first area of the substrate, and a second graphic data system file corresponding to a second pattern of the plurality of patterns for exposing a second area of the substrate, and combining the first graphic data system file and the second graphic data system file into a combined graphic data system file, wherein a plurality of first layers of the first pattern and a plurality of second layers of the second pattern are respectively combined into one layer, wherein the second layers respectively correspond to the first layers, in combining the first graphic data system file and the second graphic data system file;
a data outputting part for generating digital micromirror device on/off data from the graphic data system files to control on/off timing of the digital micromirror device; and
a transfer control part for outputting a transfer signal which transfers a stage for exposing the substrate.

12. The digital exposure device of claim 11, wherein the data outputting part generates a first digital micromirror device on/off data from the first graphic data system file and a second digital micromirror device on/off data from the second graphic data system file.

13. The digital exposure device of claim 12, wherein the data outputting part comprises a data combining part which combines said first digital micromirror device on/off data and said second digital micromirror device on/off data to produce a combined digital micromirror device on/off data.

14. The digital exposure device of claim 11, wherein the transfer control part transfers the substrate along a scanning direction in response to the digital micromirror device on/off data generated from the data outputting part.

15. The digital exposure device of claim 12, wherein the transfer control part outputs the transfer signal in response to the first digital micromirror device on/off data, transfers the substrate in a scanning direction to expose the first areas in a first exposure, repositions the substrate at a starting position, outputs the transfer signal in response to the second digital micromirror device on/off data, and transfers the substrate in said scanning direction to expose the second areas in a second exposure, wherein a scanning speed of the second exposure is greater than a scanning speed of the first exposure.

* * * * *